(12) United States Patent
Sato

(10) Patent No.: US 9,478,772 B2
(45) Date of Patent: Oct. 25, 2016

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/567,311

(22) Filed: Dec. 11, 2014

(65) Prior Publication Data

US 2015/0179978 A1    Jun. 25, 2015

(30) Foreign Application Priority Data

Dec. 25, 2013  (JP) ................................. 2013-266429

(51) Int. Cl.
*H01L 51/52*     (2006.01)
*H01L 27/32*     (2006.01)

(52) U.S. Cl.
CPC ....... *H01L 51/5275* (2013.01); *H01L 51/5209* (2013.01)

(58) Field of Classification Search
USPC .......................................................... 257/40
See application file for complete search history.

(56) References Cited

U.S. PATENT DOCUMENTS

| 2002/0084747 A1* | 7/2002 | Fujieda | H01L 51/5206 313/506 |
| 2008/0024402 A1* | 1/2008 | Nishikawa | H01L 51/5209 345/82 |
| 2010/0176717 A1* | 7/2010 | Lee | H01L 51/5271 313/504 |
| 2014/0293205 A1* | 10/2014 | Kim | G02F 1/133377 349/138 |
| 2014/0349070 A1* | 11/2014 | Chu | H01L 51/5218 428/142 |

FOREIGN PATENT DOCUMENTS

JP         2013-109932 A     6/2013

* cited by examiner

*Primary Examiner* — Selim Ahmed
*Assistant Examiner* — Lawrence Tynes, Jr.
(74) *Attorney, Agent, or Firm* — Typha IP LLC

(57) ABSTRACT

A display device related to one embodiment of the present invention includes a first substrate arranged with a plurality of pixels in the shape of a matrix, an insulation film arranged above the first substrate, a first electrode arranged above the insulation film, a second electrode arranged on an upper layer of the first electrode, and an organic EL layer arranged between the first electrode and the second electrode, wherein the insulation film includes a plurality of concave parts arranged corresponding to each of the plurality of pixels on the side of the first electrode, the first electrode, the organic EL layer and the second electrode are stacked in order above the insulation film and the concave part, and the an insulation layer is covering an end part of the first electrode arranged above the concave part is arranged on an interface part sectioning each of the plurality of pixels.

11 Claims, 9 Drawing Sheets

DISPLAY DEVICE

CROSS REFERENCE TO RELATED APPLICATIONS

This application is based upon and claims the benefit of priority from the prior Japanese Patent Application No. 2013-266429, filed on Dec. 25, 2013, the entire contents of which are incorporated herein by reference.

FIELD

The present invention is related to a display device, and especially related to an organic EL display device arranged with an organic EL (electro-luminescence) element.

BACKGROUND

An organic electro-luminescence element (referred to below as [organic EL element]) using an organic electro-luminescence material can realize each emitted color of light in the visible light band from white emitting light by selecting and organic material or by adopting a structure of an organic EL element. As a result, the development of display devices and lighting equipment which use organic EL elements is progressing.

An organic EL display device is arranged with an organic EL element in each pixel, the organic EL element in each pixel is connected to a transistor and emitted light is controlled via this transistor. The organic EL element is formed in an element substrate formed with a transistor. In the structure of a pixel, an interlayer insulation layer is generally arranged between the organic EL element and the transistor. In addition, one electrode which forms the organic EL element and a source/drain electrode of a transistor are electrically connected in a contact hole formed in the insulation layer.

An organic EL display device includes a pixel array arranged with this type of pixel in a matrix shape and light emitted from the organic EL element is emitted to the side of the element substrate or an opposing substrate arranged facing the element substrate and thereby a display surface is formed on the surface.

This type of organic EL element is arranged with a layer (referred to below as [organic electro-luminescence layer] or [organic EL layer]) including an organic electro-luminescence material between a pair of electrodes called an anode and cathode. Since light emitted by the organic EL layer spreads in all 4 π directions when expressed as a solid angle, there is a problem in effectively using light emitted in directions apart from the display screen side.

In addition, there is a problem whereby light irradiated in a parallel direction within the organic EL layer is irradiated from a transparent electrode side towards the end surface of the organic EL layer. This is because the refractive index of a material which forms the organic EL layer is high (n=1.8~1.9) and all the light which is irradiated at a specific angle at an interface with a difference refractive index is reflected. For example, all the light reflected at an interface between an organic EL layer and a transparent electrode, and between a glass substrate and air is either wave guided within the organic EL layer or glass substrate and absorbed with the layer or is emitted from the end surface of the glass substrate.

It is said that the extraction ratio (ratio of the amount of light irradiated to the glass substrate side as a proportion of the total amount of light in the organic EL layer) of light generated by an organic EL layer is about 20% due to light being wave guided within the organic EL layer in this way. It is important to increase the extraction ratio of light generated by an organic EL layer in order to reduce power consumption of an organic EL display device formed using an organic EL element.

Therefore, in a conventional organic EL display device, a diffraction grating comprised from a concave layer is formed above a transparent electrode, a transparent electrode, organic EL layer and metal electrode are stacked in order above the diffraction grating to form an organic EL element in order to attempt to improve the extraction ratio of light using the diffraction effects caused by the concave shape diffraction grating (for example, refer to Japanese Laid Open Patent 2013-109932).

However, according to the conventional organic EL display device described in the patent document mentioned above, it was necessary to manufacture an uneven shaped diffraction grating so that an uneven wavenumber and an uneven depth distribution etc in a Fourier transformed image have a constant numerical value, and because a high level of precision is demanded in the manufacturing process, there was a danger that the manufacturing process would become complex and manufacturing costs would increase.

In addition, according to a conventional organic EL display device, in a pixel arranged with an organic EL element, there is a danger that mixing of colors may occur when light emitted in a diagonal direction of a pixel becomes leaked light emitted from an adjacent pixel. However, the aperture ratio of a pixel decreases when the width of a light shielding layer which sections a region of a pixel is increased in order to reduce the effects of mixing colors, and there is danger that light emitted from an organic EL element cannot be used effectively.

Therefore, the present invention aims to effectively use light emitted from an organic EL element as light emitted in each pixel in an organic EL display device. In addition, it is an aim of the present invention to realize a simple structure which improves the extraction ratio of light from each pixel without significantly changing the manufacturing process.

SUMMARY

An organic EL display device related to one embodiment of the present invention includes a first substrate arranged with a plurality of pixels in the shape of a matrix, an insulation film arranged above the first substrate, a first electrode arranged above the insulation film, a second electrode arranged on an upper layer of the first electrode, and an organic EL layer arranged between the first electrode and the second electrode, wherein the insulation film is arranged with a plurality of concave parts arranged corresponding to each of the plurality of pixels on the side of the first electrode, the first electrode, the organic EL layer and the second electrode are stacked in order above the insulation film and the concave part, and the an insulation layer is covering an end part of the first electrode arranged above the concave part is arranged on an interface part sectioning each of the plurality of pixels.

The plurality of concave parts may be arranged at a pitch to obtain a desired wavelength of an emitted color for each corresponding pixel.

The plurality of concave parts may include a slanted surface on a side surface, a slant angle of the slanted surface being larger than 45 degrees and smaller than 90 degrees.

The first electrode may be a reflection electrode and the second electrode may be a transparent electrode.

The plurality of concave parts may include a square shaped upper surface, and an extending direction of a long side of the square shaped upper surface may be arranged in a plurality of directions in the pixel.

The insulation film and the plurality of concave parts may be formed using a resin material.

A second electrode may be further arranged facing the first substrate, wherein the second substrate may be arranged with a color filter arranged corresponding to each of the plurality of pixels.

In addition, an organic EL display device related to one embodiment of the present invention includes a first substrate arranged with a plurality of pixels in the shape of a matrix, wherein the first substrate includes an organic EL light emitting layer arranged corresponding to each of the plurality of pixels above the first substrate, the organic EL light emitting layer having a structure wherein a first electrode including a plurality of protruding parts, an organic EL layer and a second electrode are stacked in order, and an insulation layer arranged corresponding to an interface part sectioning each of the plurality of pixels, the insulation layer being arranged to cover an end part of the protruding part of the first electrode.

The first electrode may be arranged with the protruding part and a thin film shaped flat part arranged below the protruding part.

The first electrode may be arranged with an ITO film between the protruding part and the flat part.

DESCRIPTION OF EMBODIMENTS

The embodiments of the present invention are explained below while referring to the diagrams. Furthermore, the present invention should not be interpreted as being limited to the embodiments below and various modifications are possible without departing from the scope of the invention.

Figure 1:
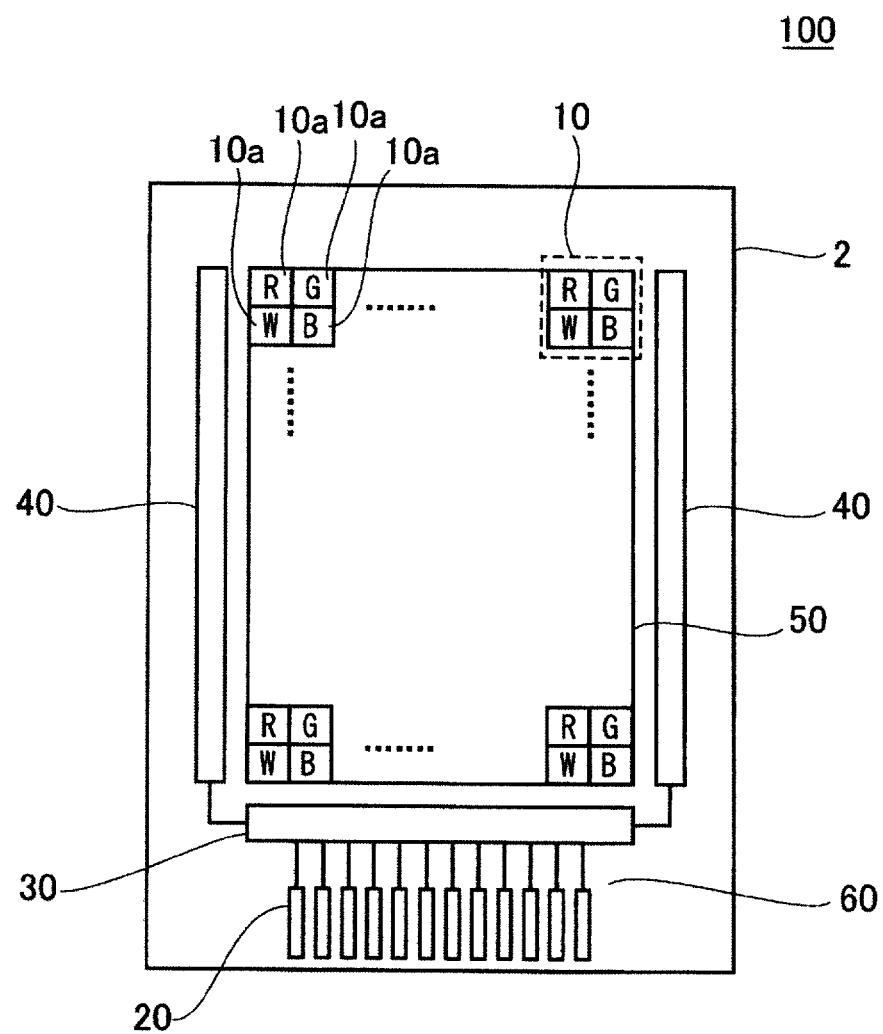
FIG. 1 is a planar view diagram showing a schematic structure of an organic EL display device related to one embodiment of the present invention.
Figure 2:
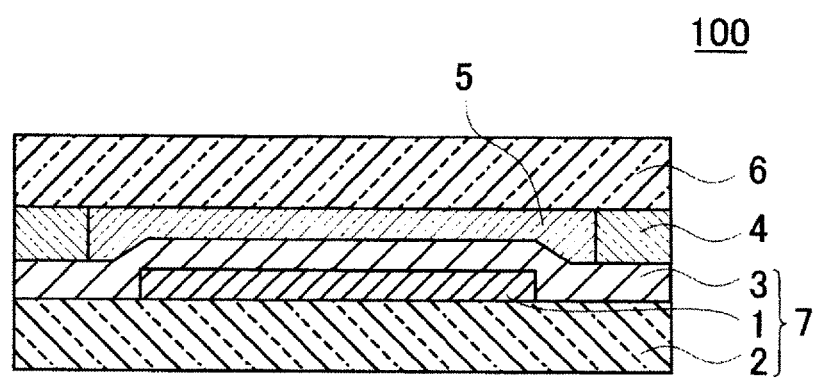
FIG. 2 is a vertical cross-sectional diagram showing a stacked structure of an organic EL display device related to one embodiment of the present invention.

First, a schematic structure of an organic EL display device related to one embodiment of the present invention is explained while referring to FIG. 1 and FIG. 2.

FIG. 1 is a planar view diagram showing a schematic structure of an organic EL display device 100 related to one embodiment of the present invention. As is shown in FIG. 1, a plurality of pixels 10 are arranged in the shape of a matrix above a hard substrate 2 such as glass at the center of the organic EL display device 100. One pixel 10 is formed by four pairs of sub-pixels 10a. Four sub-pixels 10a each emit three primary colors (red (R), green (G) and blue (B)) respectively. A display region 50 in which an image is displayed is formed by selecting and adjusting the amount of light emitted by each sub-pixel 10a included in the plurality of pixels 10 and driving the pixels. In addition, drive circuits (X driver, Y driver, shift register etc) 30, 40 are arranged in a periphery region of the display region 50 for selecting and adjusting the amount of light emitted by each pixel 10 within the display region and driving the pixels.

Furthermore, multiple wiring patterns are formed for conducting with each circuit 30, 40, supplying a power voltage and drive voltage to each drive circuit 30, 40 and connecting to ground. An end part of each wiring pattern is connected to a metal electrode 20 above a substrate 2 respectively. Each metal electrode 20 may be formed as a terminal region 60 connected to a flexible printed circuit substrate (not shown in the diagram) for supplying and external drive power, a drive signal and an earth potential for example.

Next, a stacked structure of the organic EL display device 100 related to one embodiment of the present invention is explained while referring to FIG. 2. FIG. 2 is a vertical cross-sectional diagram showing a stacked structure of the organic EL display device 100.

As is shown in FIG. 2, the organic EL display device is arranged with an organic EL light emitting layer 1 which forms each pixel of the display region 50 above a hard substrate 2 such as glass. Although the details are omitted from FIG. 2, the organic EL light emitted layer 1 is formed, for example, by stacking a TFT drive circuit layer, a reflection electrode, an organic EL layer, and a transparent electrode in order from the substrate 2. For example, the organic EL layer is formed by stacking a hole injection layer, a hole transport layer, a light emitting layer, an electron transport layer and an electron injection layer.

It is necessary to close the organic EL light emitting layer 1 from external air since it rapidly degrades when exposed to the water component in the atmosphere. As a result, the surface of the organic EL layer 1 is covered by a transparent sealing film 3 comprised from SiN etc formed by a CVD film forming method and is also covered by a substrate 6 comprised from a hard transparent material such as glass. However, the sealing layer 3 may be omitted if it is possible to close the organic EL light emitting layer 1 from external air. Furthermore, a structure may also be used wherein the sealing layer 3 replaces the substrate 6 while covering the organic EL light emitting layer 1. In other words, a structure is possible wherein a substrate, the substrate 6, which faces the substrate 2 is not formed. Below, a structure in which the organic EL light emitting layer and sealing film 3 are formed above the substrate 2 is referred to as [first substrate 7] and the substrate 6 is referred to as [second substrate 6].

The organic EL display device is filled with a transparent resin 4, 5 such as an epoxy resin for example, in order to maintain the surface of the organic light emitting layer 1 and the surface of the second substrate 2 in parallel by maintaining a fixed distance between the first substrate 8 and second substrate 6 in a gap between therein and also to prevent reflection or refraction at the interface between the two. In addition, apart from the resins 4, 5, a gap may be maintained between the first substrate 7 and second substrate 6 using a known material such as a sealing material. The second substrate 6 may include a color filter or may be a thin film device etc arranged with a touch panel function according to the specifications of the organic EL display device.

The organic EL display device including the first embodiment and second embodiment having this type of structure is explained below while referring to FIG. 3 to FIG. 7.

First Embodiment

Figure 3:
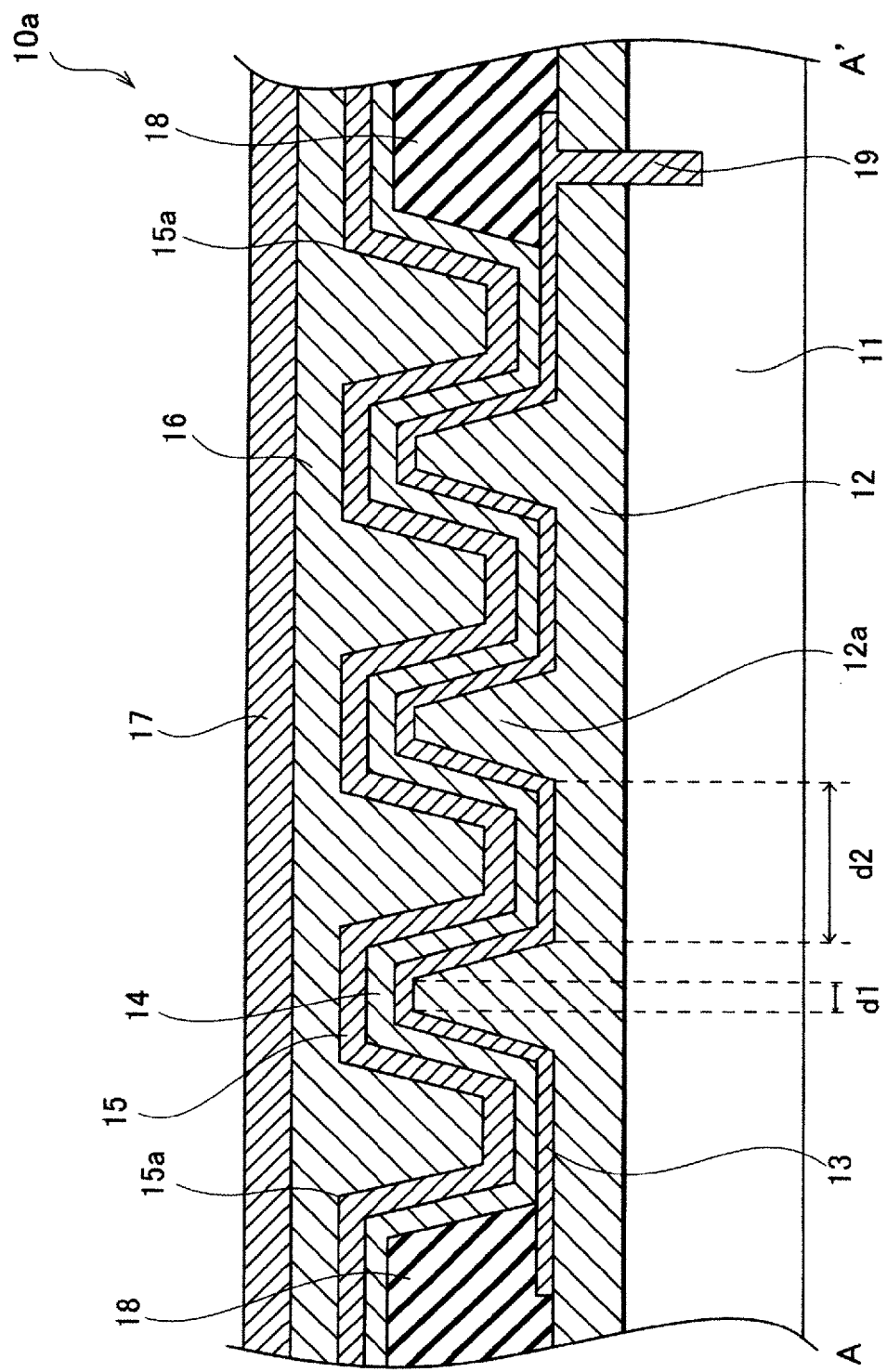
FIG. 3 is a cross-sectional diagram showing a schematic structure of an organic EL display device related to the first embodiment of the present invention.

FIG. 3 is a cross-sectional diagram showing a schematic diagram of an organic EL display device related to a first embodiment of the present invention. Furthermore, FIG. 3 depicts a structure corresponding to the first substrate 7 shown in FIG. 2 and a depiction of the opposing substrate corresponding to the second substrate shown in FIG. 2 is omitted.

Here, a substrate 11 shown in FIG. 3 shows a structure arranged with a TFT drive circuit layer above the substrate 2 shown in FIG. 2 and is referred to below as [TFT substrate 11]. In addition, FIG. 3 exemplifies a cross-sectional structure of one sub-pixel 10a which forms one pixel 10 shown in FIG. 1. The details of a structure similar to the structure described using FIG. 1 and FIG. 2 is omitted below.

As is shown in FIG. 3, the organic EL display device 100 related to the first embodiment of the present invention is arranged with a structure in which a reflection electrode (anode) 13, organic EL layer 14 and transparent electrode (cathode) 15 are stacked above the TFT substrate 11. The TFT substrate 11 is arranged with a TFT drive circuit layer and an insulation film 12 is arranged above the TFT drive circuit layer. The reflection electrode 13 is formed above the insulation film 12 and the insulation film 12 includes a plurality of convex parts 12a which protrude towards the side formed with the reflection electrode 13.

Furthermore, a structure wherein the TFT drive circuit layer included in the TFT substrate 11, the reflection electrode 13, the organic EL layer 14 and the transparent electrode 15 shown in FIG. 3 corresponds to the structure of the organic EL light emitting layer 10 shown in FIG. 1. The reflection electrode 13 is connected to a light emitting control element (transistor) included in the TFT drive circuit layer and light emitted by the organic light emitting layer 14 in each pixel 10 is controlled by the light emitting control element.

As is shown in FIG. 3, each sub-pixel 10a is mutually sectioned by an insulation layer (bank layer) 18 arranged at the interface between adjacent sub-pixels 10a. That is, by arranging an end part of the reflection electrode 13 so as to be covered by the insulation layer 18, each sub-pixel 10a is mutually insulated from the reflection electrode 13 of each adjacent sub-pixel 10a. In each sub-pixel 10a, an end part of the reflection electrode 13 is respectively connected to a light emitting control terminal included in the TFT drive circuit layer of the TFT substrate 11 via a through electrode 19 arranged in a contact hole formed through the insulation film 12. In this case, the through electrode 19 and contact hole formed in the insulation film 12 may be formed in the insulation film 12 below the insulation layer 18.

The insulation film 12 includes a plurality of convex parts 12a arranged separately at a certain pitch d2 within a region enclosed by the insulation 18. Each of the plurality of convex 12a includes a slanted surface on a side surface respectively and are arranged so that the slanted surfaces of adjacent convex parts 12a mutually face each other. The slant angle of the slanted surface formed on a side surface of the convex part 12a may be larger than 45 degrees and less than 90 degrees. In this way, a taper shaped concave part with a narrowing tip in a lower direction is formed between adjacent convex parts 12a. In this case, the cross-sectional shape of the convex part 12a may include a larger trapezoid shape at a lower base than an upper base as is shown in FIG. 3.

The convex part 12a may also include an upper surface part extending in a horizontal direction by the length d1 shown in FIG. 3 and may also include a roughly quadrangular prism shape. Furthermore, if the shape of the convex part 12a is a convex shape including a slanted surface on a side surface then it may include a smooth semicircular peak part or roughly triangular cross section and is not limited to the structure shown in the diagram. In addition, the size and shape of the peak part of the convex part 12a and the number arranged and arrangement pitch d2 may be adjusted in order to obtain a desired wavelength of an emitted color for each pixel 10. For example, in each sub-pixel 10a, the arrangement pitch d2 of the convex part 12a may be formed in order to obtain the wavelength of three prime colors (RGB) so that each becomes R>G>B. It is possible to improve the luminosity of emitted light by matching the arrangement pitch d2 of a convex part 12a with the wavelength of an emitted color of light.

The convex part 12a having this type of structure may be formed as one unit with the insulation film 12 or may be formed separately above a thin film shaped insulation film. For example, the insulation film 12 may be formed using a flat film using a resin such as acryl. The convex 12a may be formed using a nano-print method or an existing patterning method when forming the insulation film 12. In this way, the convex part 12a of the insulation film 12 can be formed cheaply with a simple structure without significantly changing the existing manufacturing process.

In this way, the insulation film 12 adopts a concave and convex structure by arranging a plurality of convex parts 12a in the insulation film 12 at a certain pitch d2. Therefore, the reflection electrode 13, organic EL layer 14 and transparent electrode 15 formed above the insulation film 12 are also formed having a concave and convex structure. In this way, by forming a concave part comprised from the reflection electrode 13, organic EL layer 14 and transparent electrode 15 between adjacent convex parts 12a, after repeatedly reflecting the light which is generated by the organic EL layer 14 having a concave part by the surface of the reflection electrode 13 which is on the inner side of the concave part, it is possible to emit the light in an upwards direction using the reflection electrode 13 formed above the slanted surface of the convex part 12a. Therefore, conventionally, it is possible to emit light which is wave guided in a horizontal direction through the interior of the organic EL layer 14 towards the display screen side. In this way, conventionally, although there was a danger of the problem of mixing colors occurring wherein light emitted in a diagonal direction of the pixel 10 from an adjacent pixel 10, according to the present invention it is possible to prevent a degradation in image quality due to mixing colors without increasing the width of a light shielding layer which sections a pixel 10 and it is possible to provide a high quality organic EL display device.

Furthermore, by arranging the reflection electrode 13 with a convex part 12a which forms a sub-microscale concave and convex structure (what is called a moth eye structure)

for example, it is possible to prevent reflection or external light irradiating to the display region 50. In addition, because it is possible to effectively use all of the bottom surface, upper surface and side surface of the concave and convex structure as a light emitting region, it is possible to increase the area of the organic EL layer 14 which contributes to emitting light within the limited display region 50, and it is possible to improve the extraction ratio of light due to light being emitting from a wider area. Therefore, according to the present embodiment, it is possible to provide an organic EL display device which can display a high resolution image at high image quality.

A first sealing layer 16 may be formed above an upper surface of the transparent electrode 15 including a concave and convex structure formed above the insulation film 12 including this type of convex part 12*a* structure. By forming a resin such as acryl so as to planarize the concave and convex shape of the transparent electrode 15, the first sealing layer 16 becomes a layer which insulates the concave and convex parts. A second sealing layer 17 which seals the entire element may be formed using an inorganic material above the first sealing layer 16. Furthermore, the first sealing layer 16 and second sealing layer 17 shown in FIG. 3 correspond to the sealing film 3 shown in FIG. 2.

Figure 5:
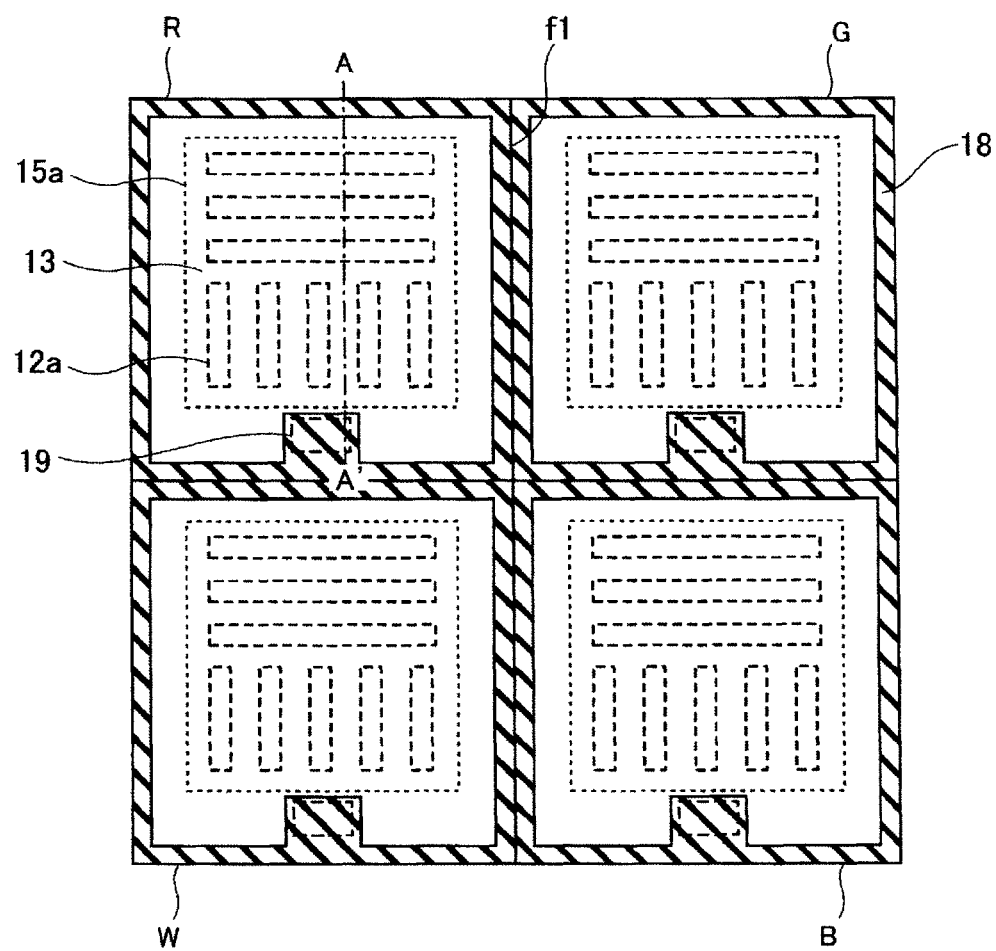
FIG. 5 is a planar view diagram showing a first example of a pixel of an organic EL display device related to one embodiment of the present invention.
Figure 6:
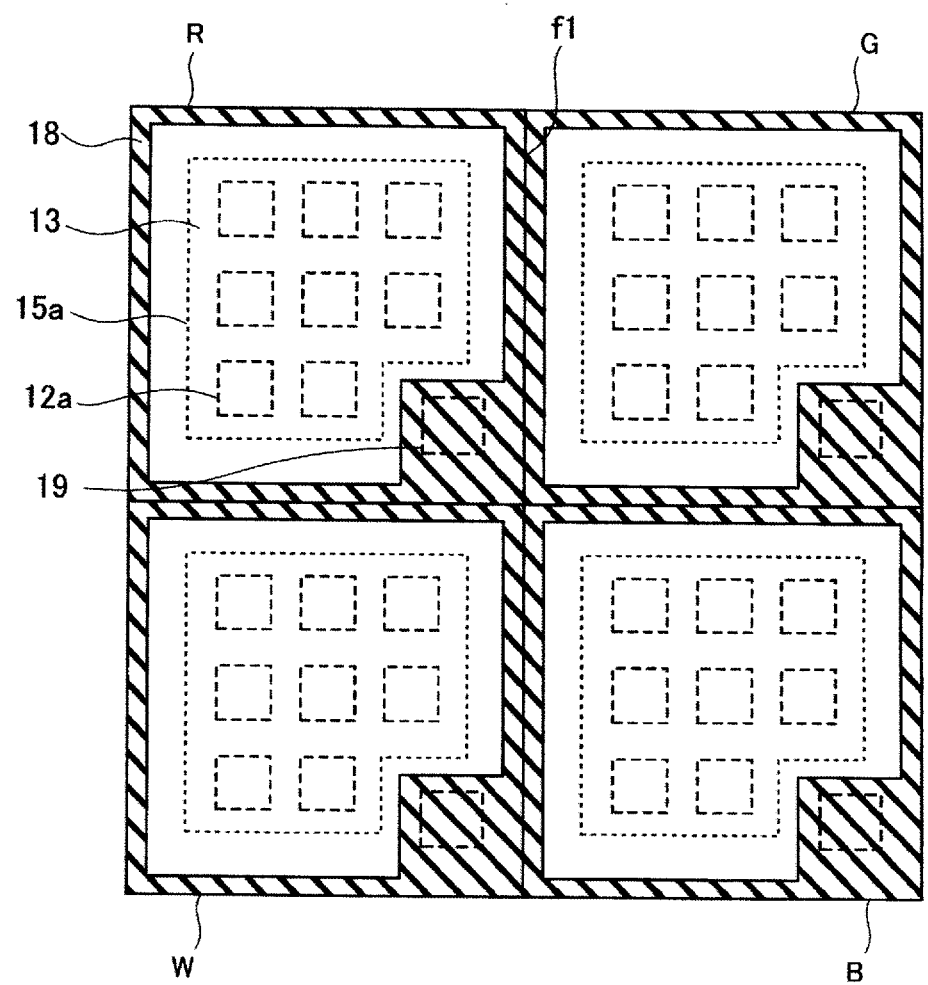
FIG. 6 is a planar view diagram showing a second example of a pixel of an organic EL display device related to one embodiment of the present invention.
Figure 7:
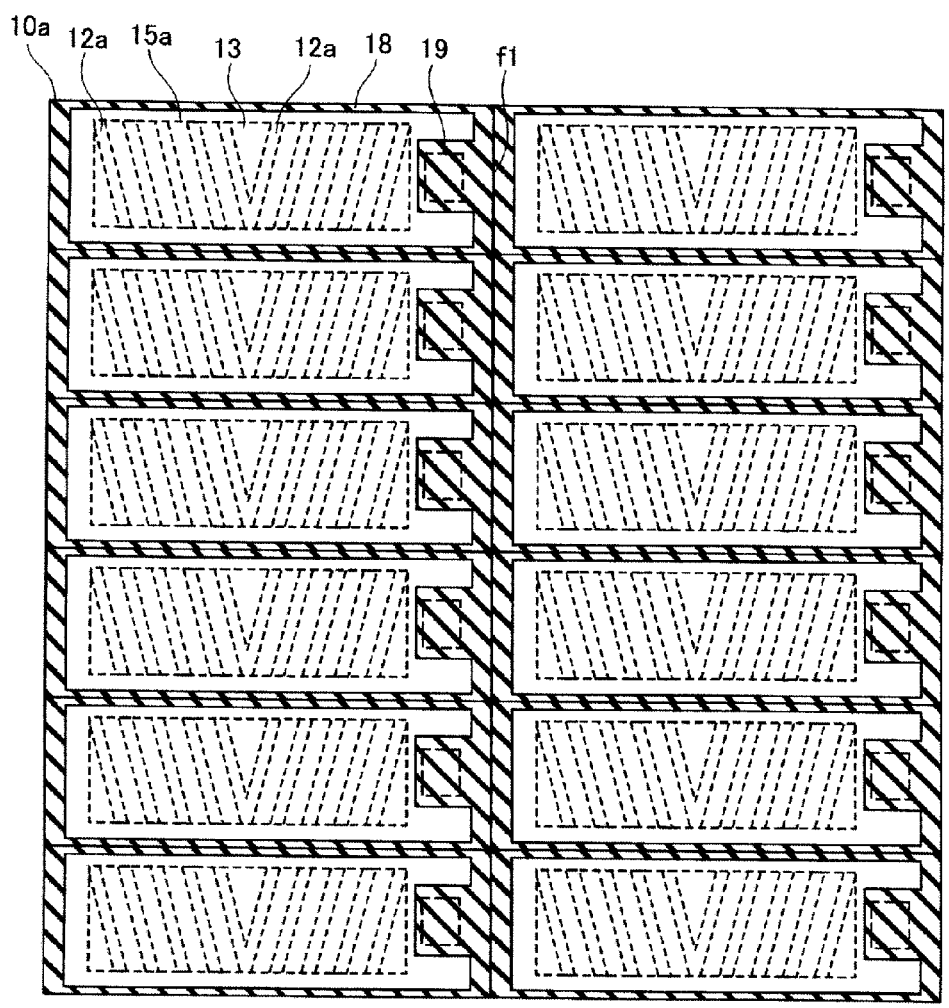
FIG. 7 is a planar view diagram showing a third example of a pixel of an organic EL display device related to one embodiment of the present invention.

An example structure of the convex 12*a* of the insulation film 12 is explained below while referring to FIG. 5 to FIG. 7. FIG. 5 to FIG. 7 are planar view diagrams showing a first to third example of the pixel 10 of the organic EL display device 100 related to one embodiment of the present invention. FIG. 5 to FIG. 7 depict a structure wherein the reflection electrode 13 and insulation layer (bank layer) 18 are arranged above an uppermost surface in order to explain the arrangement position of the convex part 12*a* and a depiction of the organic EL layer 14 and transparent electrode 15 etc is omitted. Therefore, the position of the convex part 12*a* of the insulation film 12 arranged below the reflection electrode 13 is shown by a dotted line and the position of the through electrode 19 arranged below the insulation layer 18 is shown by a dotted line. Furthermore, among the concave and convex parts of the transparent electrode 15, the position 15*a* by which the transparent electrode 15 protrudes by the thickness of the insulation layer (bank layer) 18 is shown by a dotted line.

First, the first example of a pixel 10 is explained while referring to FIG. 5. FIG. 5 depicts a structural example of one pixel 10 in which sub-pixels 10*a* of the four colors red (R), green (G), blue (B) and white (W) are arranged in a square. The cross-sectional structure of the line A-A' shown in FIG. 5 corresponds to the structure of the line A-A' shown in FIG. 3.

As is show in FIG. 5, the plurality of convex parts 12*a* may include an upper surface which is the protruding region, each having a rectangular shape respectively. As is shown in FIG. 5, when the plurality of sub-pixels 10*a* are arranged in a matrix shape in a first direction and a second direction perpendicular to the first direction, the convex part 12*a* including a rectangular upper surface having a long side extending in the first direction and the convex part 12*a* including the rectangular upper surface having a long side extending in the second direction may be arranged in sub-pixels 10*a*. In this case, the plurality of convex parts 12*a* including a roughly quadrangular shape may include a long side extending in the first direction in a first region within the sub-pixel 10*a* and the long side extending in the second direction arranged in a second region separated from the first region within the sub-pixel 10*a*.

In this way, in one pixel 10 or the regions of one sub-pixel 10*a*, because it is possible to separate a region for each of the convex parts 12*a* arranged in the same direction and arrange the plurality of convex parts 12*a* in different directions respectively, it is possible to make the direction of emitted light a plurality of directions and widen the viewing angle distribution of emitted light. In addition, on a concave part between adjacent convex parts 12*a*, as is described above referring to FIG. 3, it is possible to emit light towards an upwards direction after reflecting the light generated by the organic EL layer 14 at various angles. Therefore, by determining the size and arrangement position of a convex part so that the emitting direction of light and light strength is adjusted, it is possible to achieve an improvement in the luminosity of emitted light.

Next, the second example of the pixel 10 is explained while referring to FIG. 6. As is shown in FIG. 6, the plurality of convex parts 12*a* having a roughly square shape and the through electrode 19 may be arranged in a lattice shape according to the size of the pixel region. In this case, by making a region in which a convex part 12*a* is arranged an L shaped region as is shown in FIG. 6, it is possible to secure a large region in which the through electrode 19 is arranged. Therefore, it is possible to increase the size of a contact hole in which the through electrode 19 is arranged and sufficiently secure conductivity of the through electrode 19. In addition, by matching the length of pairs of surfaces of opposing convex parts 12*a* and arranged the convex part 12*a* to match the shape of an L shaped region, it is possible to effectively use the region as a light emitting region.

In this way, by arranging the plurality of convex parts 12*a* having a polygonal shape seen from a planar view across the entire pixel region to match the length of pairs of surfaces of opposing convex parts 12*a*, it is possible to secure a large area of the organic EL layer 14 which contributes to emitting light even in a limited pixel region. Therefore, it is possible to improve the extraction ratio of light. Here, the upper surface shape of a convex part 12*a* is not limited to the square shape shown in FIG. 6, for example, the convex part 12*a* may have a hexagonal shape or a triangular shape. In this way, according to the structure of the second example shown in FIG. 6, it is possible form the organic EL display device 100 having wider viewing angle characteristics and which can improve the luminosity of emitted light the same as the first example shown in FIG. 5.

Furthermore, a third example of a pixel 10 is explained while referring to FIG. 7. As is shown in FIG. 7, in the case where each sub-pixel 10*a* has a rectangular shape, an arrangement is possible with the center part of the long side of a rectangle of each sub-pixel 10*a* at the border so that the plurality of rectangular shaped convex parts 12*a* becomes symmetrical.

In this case, as is shown in FIG. 7, an extension direction of the long side of the upper surface part of the rectangular shaped convex part 12*a* may each be arranged in a slanted direction with respect to the first direction and second direction which are the arrangement directions of the pixel 10. In this way, by separating one sub-pixel 10*a* into two regions with the center part of the long side at the border, and arranging the plurality of convex parts 12*a* arranged in the two regions so that alternate arrangement directions become symmetrical, it is possible to form a light emitting region in which light is emitted in two different directions within one pixel 10. Therefore, even in the structure of the third example shown in FIG. 7, it is possible form the organic EL display device 100 having wider viewing angle characteristics and which can improve the luminosity of emitted light the same as the first example shown in FIG. 5 and second example shown in FIG. 6.

The insulation film 12 of the organic EL display device related to the first embodiment of the present invention is formed by providing the convex part 12a with the structure described above. According to the organic EL display device related to the first embodiment of the present invention, because it is possible to effectively use light emitted by the organic EL layer 14 as light emitted in each pixel, it is possible to prevent degradation of image quality due to mixing colors and provide an organic EL display device with improved light emitting efficiency and low power consumption.

Second Embodiment

Figure 4:
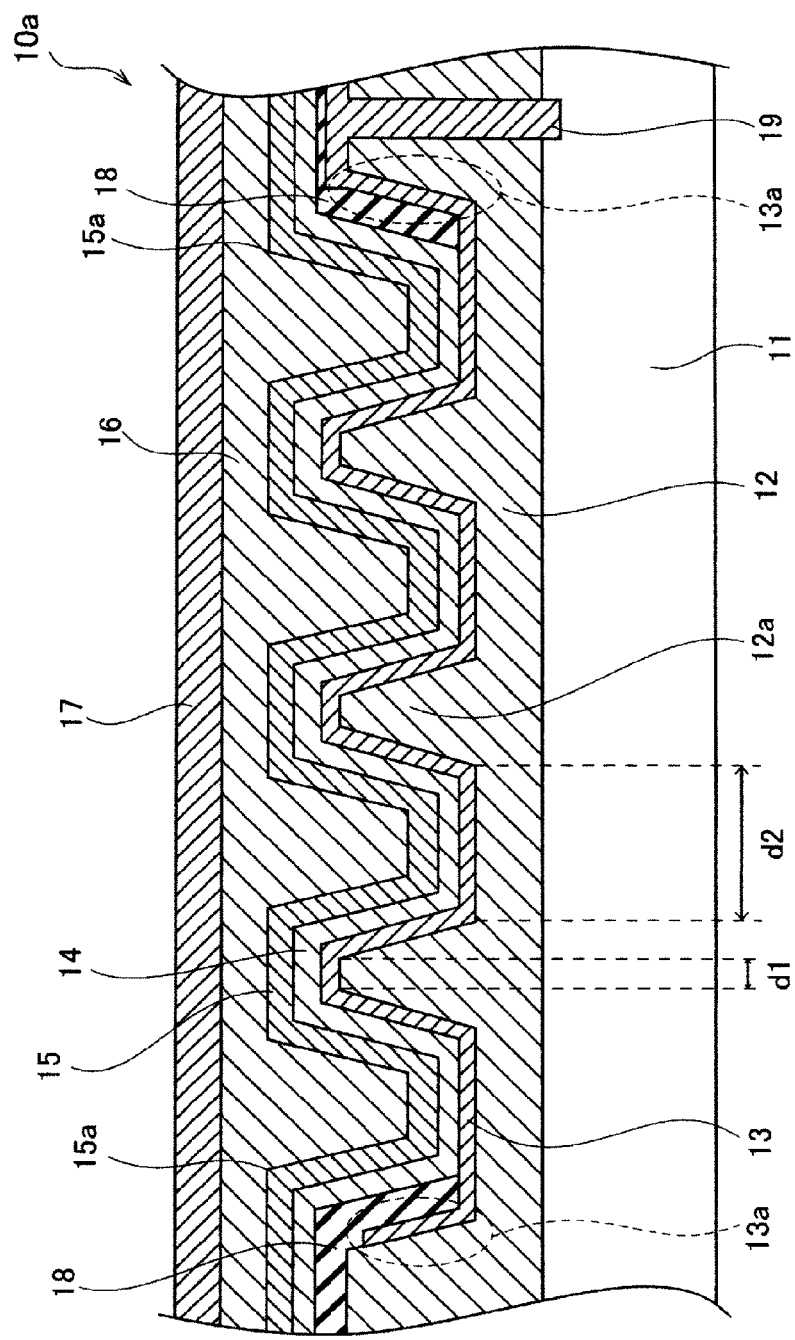
FIG. 4 is a cross-sectional diagram showing a schematic structure of an organic EL display device related to the second embodiment of the present invention.

A schematic structure of an organic EL display device related to the second embodiment of the present invention is explained below while referring to FIG. 4. FIG. 4 is a cross-sectional diagram showing a schematic structure of an organic EL display device related to the second embodiment of the present invention. As is shown in FIG. 4, the organic EL display device related to the second embodiment of the present invention has a different structure to the organic EL display device related to the first embodiment shown in FIG. 3 in that an end part of the reflection electrode 13 which is covered by the insulation layer (bank layer) 18 is formed above the convex part 12a of the insulation film 12. Therefore, the same reference symbols are attached to the same structure described above using FIG. 3 and repeated explanations are omitted.

As is shown in FIG. 4, an end part 13a of the reflection electrode 13 is formed above a slanted surface of a side surface of the convex part 12a. In this case, the through electrode 19 is formed to pass through the convex part 12a of the insulation film 12 and is connected to the end part 13a of the reflection electrode 13. By arranging the end part 13a of the reflection electrode 13 above a slanted surface of the convex part 12a, it is possible to increase the area of a region in which light is reflected by the reflection electrode 13 compared to the first embodiment shown in FIG. 3. That is, because it is possible to form a concave part between the end part 13a of the reflection electrode 13 and adjacent convex parts 12a, it is possible to further reflect towards an upper direction light generated by the organic EL layer 14 on an inner side of the concave part using the end part 13a of the reflection electrode 13 arranged above a slanted surface of the convex part 12a. Therefore, according to the organic EL display device related to the second embodiment shown in FIG. 4, it is possible to improve the extraction ratio of light.

In addition, the structure of the convex part 12a of the insulation film 12 in the organic EL display device related to the second embodiment of the present invention may have the structure of the convex part 12a in the first to third examples described using FIG. 5 to FIG. 7 the same as the organic EL display device related to the first embodiment shown in FIG. 3. Therefore, the organic EL display device related to the second embodiment may also include a structure provided with wider viewing angle characteristics and improved luminosity of emitted light.

As described above, according to the organic EL display device related to the second embodiment of the present invention, because it is possible to effectively use light emitted by the organic EL layer 14 as emitted light in each pixel the same as the organic EL display device related to the first embodiment of the present invention, it is possible to prevent degradation of image quality due to mixing colors and provide an organic EL display device with improved light emitting efficiency and low power consumption.

Furthermore, in the structure described above referring to FIG. 1, FIG. 5 and FIG. 6, although each sub-pixel 10a included in a pixel 10 was explained arranged with the organic EL layer 14 which emits light in different colors RGBW for example, each pixel 10 may be arranged with an organic EL layer 14 which emits white light. A structure of an organic EL display device formed with the first substrate 7 arranged with a white light emitting organic EL layer 14 and the second substrate 6 arranged with a color filter is explained below while referring to FIG. 8.

Figure 8:
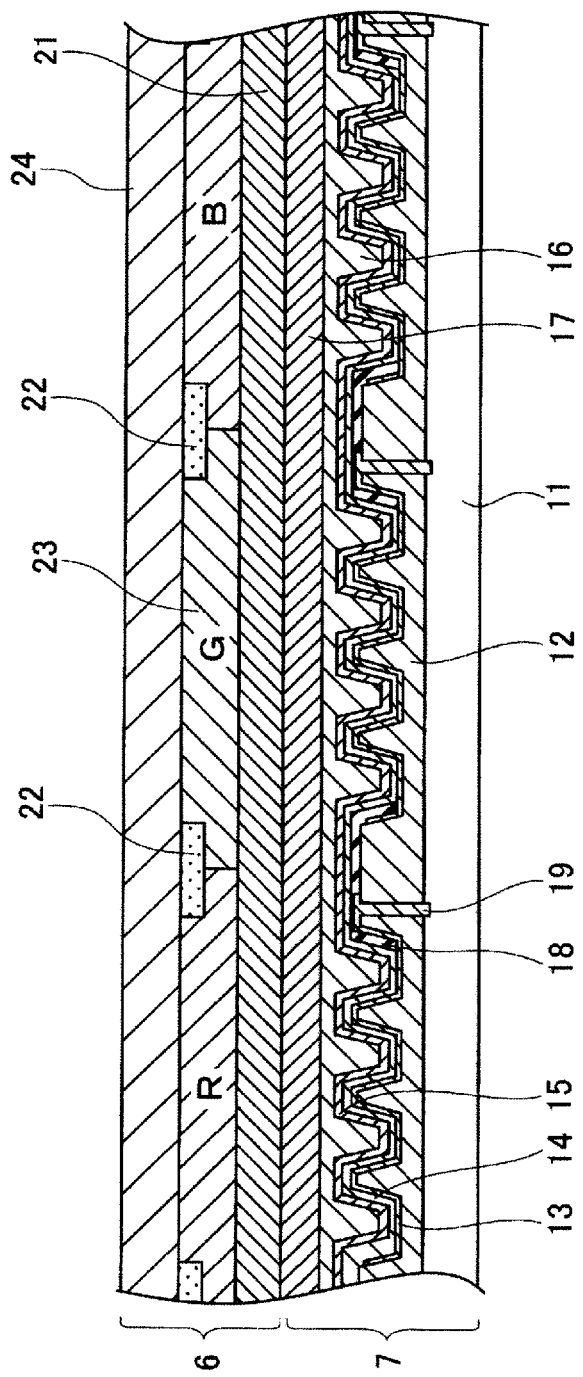
FIG. 8 is a cross-sectional diagram showing a schematic structure of an organic EL display device related to one embodiment of the present invention.

FIG. 8 is a cross-sectional diagram showing the structure of an organic EL display device arranged with a second substrate 6 arranged with a color filter above a first substrate 7 arranged with the same structure as the organic EL display device related to the second embodiment shown in FIG. 4.

As is shown in FIG. 8, the color filter 23 is colored with three different primary colors (RGB) for example corresponding to each sub-pixel 10a and a black matrix 22 which sections the color filter for each color may also be arranged. In addition, as is shown in FIG. 8, an upper surface of the color filter 23 formed above a substrate 24 may be covered by a coat layer 21.

In this way, the organic EL display device related to an embodiment of the present invention is formed so that white light from the organic EL layer 14 passes through the color filter corresponding to each sub-pixel 10a. White emitted light is colored by passing through a color filter and it is possible to display a color image.

Furthermore, although a structure in which each of a plurality of sub-pixels 10a is arranged corresponding to a color filter of each of the three primary colors (RGB) is depicted in FIG. 8, a structure arranged with a sub-pixel 10a corresponding to white light (W) is also possible. A sub-pixel 10a corresponding to white light (W) can be realized by a structure in which a color filter is not formed or a structure in which an ND filter is formed for example. By providing a luminosity component to a sub-pixel 10a corresponding to white light (W), it is possible to form an organic EL display device with improved light emitting efficiency and low power consumption.

In addition, although a structure in which a convex part 12a is arranged in an insulation film 12 in the structure of the organic EL display device was explained while referring to FIG. 3 to FIG. 8, a concave and convex structure may also be formed in the reflection electrode 13 instead of in the insulation film 12. A structure of an organic EL device in which he reflection electrode 13 is arranged with protruding parts 13-2 is explained while referring to FIG. 9.

Figure 9:
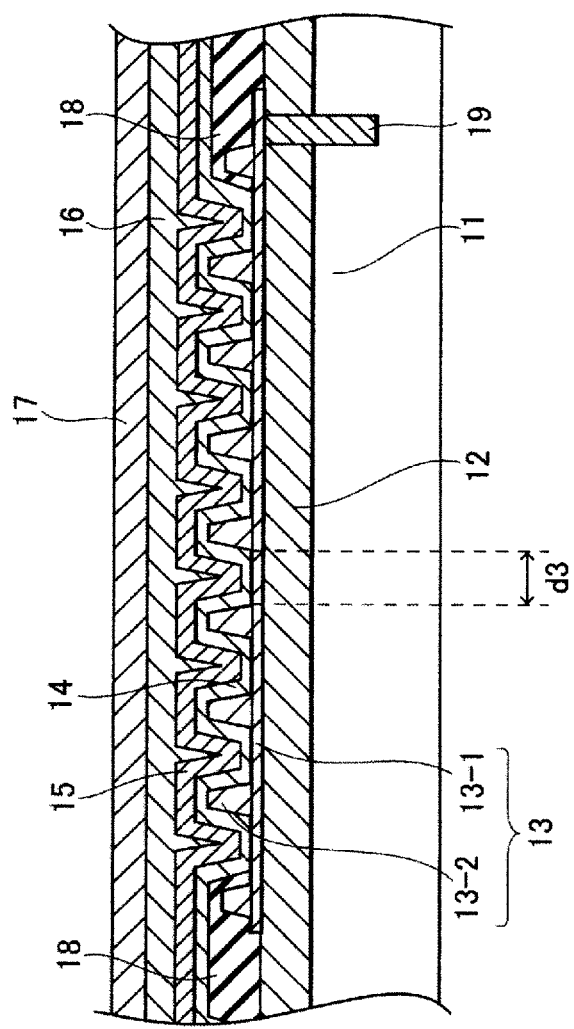
FIG. 9 is a cross-sectional diagram showing a schematic structure of an organic EL display device related to one embodiment of the present invention.

FIG. 9 is a cross-sectional diagram showing a schematic structure of an organic EL display device related to an embodiment of the invention. Here, FIG. 9 depicts a structure corresponding to the first substrate 7 shown in FIG. 2 the same as the cross-sectional structure of the organic EL display device related to the first embodiment and second embodiment shown in FIG. 3 and FIG. 4, and a depiction of an opposing substrate corresponding to the second substrate 6 shown in FIG. 2 is omitted. In addition, the same reference symbols are attached to the same structure described above referring to FIG. 2 and FIG. 4 and repeated explanations are omitted below.

As is shown in FIG. 9, the reflection electrode 13 is arranged with a flat part 13-1 and a plurality of protruding parts 13-2. Here, the protruding parts 13-2 of the reflection electrode 13 may be arranged with the same shape and structure as the convex part 12a of the insulation film 12 described while referring to FIG. 1 to FIG. 8.

The flat part 13-1 and protruding part 13-2 of the reflection electrode 13 may be formed using two different types of material. For example, a second electrode material may be formed above the flat part 13-1 after forming a thin film shaped flat part 13-1 using a first electrode material and the plurality of protruding parts 13-2 may be formed by etching the second electrode material. For example, silver, IZO and ITO etc can be used for the first electrode material and second electrode material. In this case, an ITO film may be formed above an upper surface of the first electrode material as a stopper layer when etching the second electrode material and the second electrode material may be formed above the ITO film.

By forming the protruding part 13-2 of the reflection electrode 13 by finely etching the second electrode material, the organic EL layer 14 and transparent electrode 15 are formed according to the concave and convex shape of the reflection electrode 13 above the reflection electrode 13. In this case, as is shown in FIG. 9, the protruding part 13-2 of the reflection electrode 13 and the transparent electrode 15 may be formed in a mutual nested state sandwiching the organic EL layer 14.

Here, an arrangement pitch d3 of the protruding part 13-2 of the reflection electrode 13 may be formed small to about the same thickness as the organic EL layer 14. In this way, it is possible to form a concave and convex structure comprised form the reflection electrode 13, organic EL layer 14 and transparent electrode 15 to a high density in each pixel 10, and because it is possible to reduce the distance between opposing reflection electrodes 13 in a concave part as much as possible, it is possible to reflect light emitted from the organic EL layer 14 between reflection electrodes 13 the same as laser oscillation and improve the luminosity of emitted light.

In addition, as shown in FIG. 9, the protruding part 13-2 may be arranged at an end part of the reflection electrode 13 which is covered by the insulation film (bank film) 18. Because a slanted surface is arranged on a side surface of the protruding part 13-2 of the reflection electrode 13, light generated by the organic EL layer 14 can be reflected by this slanted surface an directed in an upwards direction the same as the organic display device related to the second embodiment shown in FIG. 4. Therefore, it is possible to improve the extraction ratio of light even using the organic EL display device related to one embodiment of the present invention shown in FIG. 9.

As explained above, according to the present invention, because it is possible to effectively use light emitted by the organic EL layer 14 as emitted light in that pixel 10, it is possible to provide an organic EL display device which can improve the extraction ratio of light emitted from each pixel 10. In addition, because it is possible to prevent mixing colors of a pixel, it is possible to improve image quality, realize high resolution and provide an organic EL display device which can be manufactured cheaply and with a simple structure.

What is claimed is:

1. A display device comprising:
   a first substrate arranged with a plurality of pixels in the shape of a matrix;
   an insulation film arranged above the substrate;
   a first electrode arranged above the insulation film;
   a second electrode arranged above the first electrode; and
   an organic EL layer arranged between the first electrode and the second electrode;
   wherein
   the insulation film includes a plurality of convex parts arranged corresponding to each of the plurality of pixels on the side of the first electrode;
   the first electrode, the organic EL layer and the second electrode are stacked in order above the insulation film and the plurality of convex parts;
   the plurality of convex parts includes a first convex part extending in a first direction and a second convex part extending in a second direction different form the first direction; and
   an insulation layer covering an end of the first electrode arranged above the plurality of convex parts is arranged on an interface part sectioning each of the plurality of pixels.

2. The display device according to claim 1, wherein the plurality of convex parts is arranged at a pitch to obtain a desired wavelength of an emitted color for each corresponding pixel.

3. The display device according to claim 1, wherein the plurality of convex parts include a slanted surface on a side surface, a slant angle of the slanted surface being larger than 45 degrees and smaller than 90 degrees.

4. The display device according to claim 1, wherein the first electrode is a reflection electrode and the second electrode is a transparent electrode.

5. The display device according to claim 1, wherein the insulation film and the plurality of convex parts are formed using a resin material.

6. The display device according to claim 1, wherein the insulation film is formed using the same material as the plurality of convex parts.

7. The display device according to claim 1, wherein the insulation film is formed using different materials from the plurality of convex parts.

8. The display device according to claim 1, further comprising:
   a second substrate arranged facing the first substrate;
   wherein
   the second substrate is arranged with a color filter arranged corresponding to each of the plurality of pixels.

9. A display device comprising:
   a first substrate arranged with a plurality of pixels in the shape of a matrix;
   an insulation film arranged above the first substrate;
   a first electrode arranged above the insulation film;
   a second electrode arranged on an upper layer of the first electrode; and
   an organic EL layer arranged between the first electrode and the second electrode;
   wherein
   the insulation film includes a plurality of convex parts arranged corresponding to each of the plurality of pixels on the side of the first electrode;
   the first electrode, the organic EL layer and the second electrode are stacked in order above the insulation film and the plurality of convex parts;
   the plurality of convex parts include a first convex part and a second convex part;
   the first convex part extends in a first direction;
   the second convex part extends in a second direction different to the first direction;
   both the first convex part and the second convex part are arranged on each of the plurality of pixels;

the plurality of pixels includes a first pixel having a first color and a second pixel having a second color, the second color being different from the first color;

the convex parts in the first pixel have a first pitch;

the convex parts in the second pixel have a second pitch; and the first pitch is different from the second pitch.

10. The display device according to claim 1, wherein the first convex part includes a rectangular upper surface with a first long side extending in the first direction; and the second convex part includes a second rectangular upper surface with a second long side extending in the second direction.

11. A display device comprising:

a first substrate arranged with a plurality of pixels in the shape of a matrix;

an insulation film arranged above the first substrate;

a first electrode arranged above the insulation film;

a second electrode arranged on an upper layer of the first electrode; and an organic EL layer arranged between the first electrode and the second electrode;

wherein the insulation film includes a plurality of convex parts arranged corresponding to each of the plurality of pixels on the side of the first electrode;

the first electrode, the organic EL layer and the second electrode are stacked in order above the insulation film and the plurality of convex parts;

each of the plurality of convex parts includes a square shaped upper surface;

the square shaped upper surface has an extending direction of a long side of the square shaped upper surface;

the plurality of convex parts include a first convex part and a second convex part;

the extending direction of the first convex part is a first direction;

the extending direction of the second convex part is a second direction different to the first direction;

both the first convex part and the second convex part are arranged on each of the plurality of pixels;

the plurality of pixels includes a first pixel having a first color and a second pixel having a second color, the second color being different from the first color;

the convex parts in the first pixel have a first pitch;

the convex parts in the second pixel have a second pitch; and the first pitch is different from the second pitch.

\* \* \* \* \*